(12) United States Patent
Chen et al.

(10) Patent No.: US 9,035,369 B2
(45) Date of Patent: May 19, 2015

(54) SEMICONDUCTOR STRUCTURE AND MANUFACTURING METHOD OF THE SAME

(75) Inventors: Shih-Hung Chen, Jhudong Township, HsinChu County (TW); Hang-Ting Lue, Hsinchu (TW); Yen-Hao Shih, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 13/401,634

(22) Filed: Feb. 21, 2012

(65) Prior Publication Data

US 2013/0214340 A1    Aug. 22, 2013

(51) Int. Cl.
*H01L 29/68* (2006.01)
*H01L 27/115* (2006.01)
*H01L 29/788* (2006.01)
*H01L 29/792* (2006.01)

(52) U.S. Cl.
CPC ...... *H01L 27/11524* (2013.01); *H01L 29/7881* (2013.01); *H01L 29/792* (2013.01); *H01L 27/11551* (2013.01); *H01L 27/1157* (2013.01); *H01L 27/11578* (2013.01)

(58) Field of Classification Search
USPC .................................. 257/314, 288, 339, 261
See application file for complete search history.

(56) References Cited

U.S. PATENT DOCUMENTS

| 7,514,288 | B2 * | 4/2009 | Lung et al. ................... 438/102 |
| 8,208,279 | B2 | 6/2012 | Lue | |
| 8,304,911 | B2 * | 11/2012 | Chen et al. ................... 257/773 |
| 8,349,734 | B2 * | 1/2013 | Augur ........................... 438/667 |
| 2007/0018201 | A1 * | 1/2007 | Specht et al. ................ 257/204 |
| 2010/0226195 | A1 * | 9/2010 | Lue ........................ 365/230.06 |
| 2011/0101443 | A1 * | 5/2011 | Huo et al. ..................... 257/324 |

FOREIGN PATENT DOCUMENTS

TW    201034169 A1    9/2010

OTHER PUBLICATIONS

TW Office Action dated Mar. 20, 2014.

* cited by examiner

*Primary Examiner* — Telly Green
*Assistant Examiner* — Damian A Hillman
(74) *Attorney, Agent, or Firm* — McClure, Qualey & Rodack, LLP

(57) ABSTRACT

A semiconductor structure and a manufacturing method of the same are provided. The semiconductor structure includes a substrate, a first stacked structure, and a first conductive layer. The first stacked structure is formed on the substrate and includes a conductive structure and an insulating structure, and the conductive structure is disposed adjacent to the insulating structure. The first conductive layer is formed on the substrate and surrounds two sidewalls and a part of the top portion of the first stacked structure for exposing a portion of the first stacked structure.

11 Claims, 10 Drawing Sheets

SEMICONDUCTOR STRUCTURE AND MANUFACTURING METHOD OF THE SAME

BACKGROUND OF THE INVENTION

1. Field of the Invention

The disclosure relates in general to a semiconductor structure and a manufacturing method of the same, and more particularly to a semiconductor structure and a manufacturing method of the same for a memory device.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory having a high element density is need.

As such, it is desirable to develop a three-dimensional (3D) flash memory structure with larger number of multiple planes being stacked to achieve greater storage capacity, improved qualities, and a low manufacturing cost for each bit.

SUMMARY OF THE INVENTION

The invention is directed to a semiconductor structure and a manufacturing method of the same, which can be used in memory devices. By using such semiconductor structure in a three-dimensional memory array, the damage to the devices caused by the high energy applied in the implantation process can be reduced, and the dimension and the manufacturing cost of the memory array can be reduced as well.

According to one embodiment of the present disclosure, a semiconductor structure is provided. The semiconductor structure comprises a substrate, a first stacked structure, and a first conductive layer. The first stacked structure is formed on the substrate and comprises a first conductive structure and an insulating structure, and the conductive structure is disposed adjacent to the insulating structure. The first conductive layer is formed on the substrate and surrounds two sidewalls and a part of a top portion of the first stacked structure for exposing a portion of the first stacked structure.

According to one embodiment of the present disclosure, a method of manufacturing a semiconductor structure is provided. The method comprises following steps. Forming a first stacked structure on a substrate, comprising steps of forming an insulating structure on the substrate and disposing a conductive structure adjacent to the insulating structure. Forming a conductive material layer on the substrate. Etching the conductive material layer to form a first conductive layer for exposing a portion of the first stacked structure, wherein the first conductive layer surrounds two sidewalls and a part of a top portion of the first stacked structure.

The disclosure will become apparent from the following detailed description of the preferred but non-limiting embodiments. The following description is made with reference to the accompanying drawings.

DETAILED DESCRIPTION OF THE INVENTION

In the embodiment of the present disclosure, a semiconductor structure and a method of manufacturing the same are provided. By using such semiconductor structure in a three-dimensional memory array, the damage to the devices caused by the high energy applied in the implantation process can be reduced, the dimension and the manufacturing cost of the memory array can be reduced as well. The embodiments disclosed below are for elaborating the semiconductor structure of the disclosure. However, the descriptions disclosed in the embodiments of the disclosure such as detailed structures, manufacturing procedures and material selections are for illustration only, not for limiting the scope of protection of the disclosure.

Semiconductor Structures

First Embodiment

Figure 1:
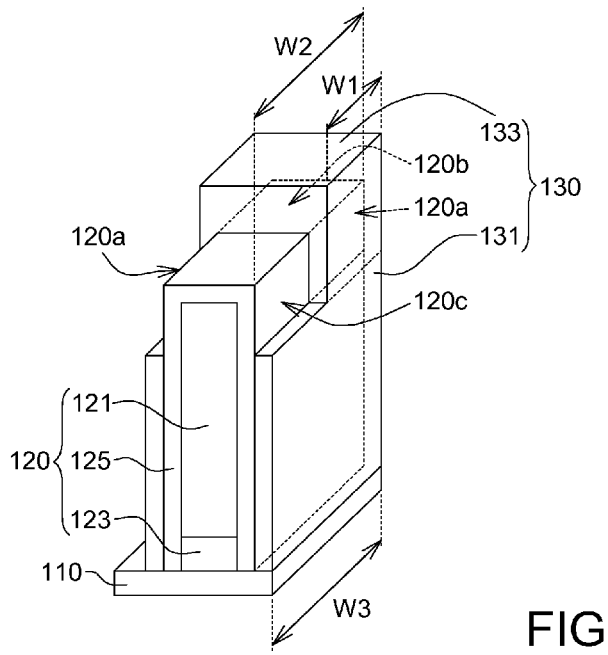
FIG. 1 shows a semiconductor structure according to the first embodiment of the present disclosure.

FIG. 1 shows a semiconductor structure according to the first embodiment of the present disclosure. The semiconductor structure 100 comprises a substrate 110, a first stacked structure 120, and a first conductive layer 130. The first stacked structure 120 is formed on the substrate 110. The first stacked structure 120 comprises a conductive structure 121 and an insulating structure 123, and the conductive structure 121 is disposed adjacent to the insulating structure 123. The first conductive layer 130 is formed on the substrate 110 and surrounds two sidewalls 120a and a part of a top portion 120b of the first stacked structure 120 for exposing a portion 120c of the first stacked structure 120. In the embodiment, the materials for the conductive structure 121 comprise silicon-containing materials, such as polysilicon. The materials for the insulating structure 123 comprise metal oxides. However, the material selections for the conductive structure 121 and the insulating structure 123 are depending on the conditions applied and are not limited to the materials aforementioned.

The first conductive layer 130 comprises a first main body 131 and a first covering portion 133 disposed on the first main body 131. The first main body 131 covers a lower portion of the two sidewalls 120a of the first stacked structure 120. The first covering portion 133 is integrated with the first main body 131 and covers an upper portion of the two sidewalls 120a and the part of the top portion 120b of the first stacked structure 120. The width W1 of the first covering portion 133 is smaller than each of the widths W2 of the corresponding sidewalls 120a for exposing the portion 120c of the first stacked structure 120.

As shown in FIG. 1, in the embodiment, the width W3 of the first main body 131 is substantially equal to each of the widths W2 of the sidewalls 120a. The width W1 of the first covering portion 133 is substantially smaller than the width W3 of the first main body 131.

In the embodiment, the conductive structure 121 is, for example, a conductive layer, and the insulating structure 123 is, for example, an insulating layer. The conductive layer is disposed on the insulating layer.

As shown in FIG. 1, the first stacked structure 120 further comprises a memory material layer 125. The memory material layer 125 is formed on the substrate 110 and covers the periphery of the conductive structure 121 and the insulating structure 123. In the embodiment, the first conductive layer 130 covers a portion of the memory material layer 125.

In the embodiment, the first conductive layer 130 has a single material, such as polysilicon. The first conductive layer 130 may have composite materials, such as polysilicon and tungsten silicide (WSi).

Second Embodiment

Figure 2:
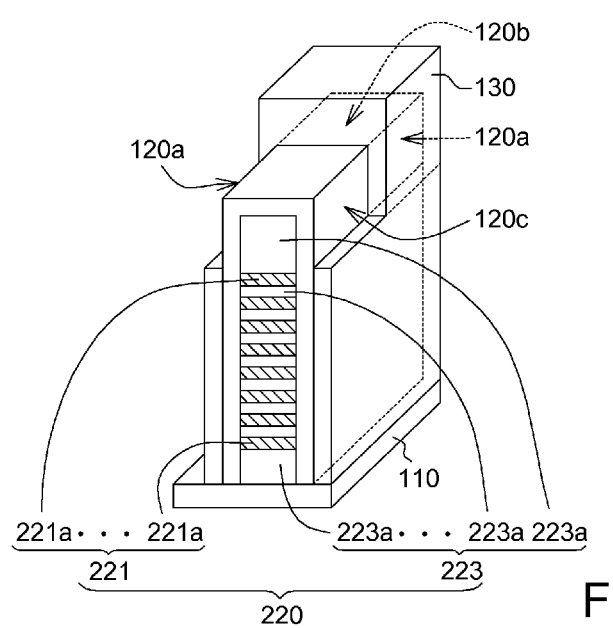
FIG. 2 shows a semiconductor structure according to the second embodiment of the present disclosure.

Referring to FIG. 2, FIG. 2 shows a semiconductor structure according to the second embodiment of the present disclosure. The elements in the first and second embodiments sharing the same labeling are the same elements, and the description of which are as aforementioned.

The semiconductor structure 200 comprises the substrate 110, a first stacked structure 220, and the first conductive layer 130. The first stacked structure 220 is formed on the substrate 110. The first stacked structure 220 comprises a conductive structure 221 and an insulating structure 223, and the conductive structure 221 is disposed adjacent to the insulating structure 223. The first conductive layer 130 is formed on the substrate 110 and surrounds the two sidewalls 120a and the part of the top portion 120b of the first stacked structure 120 for exposing the portion 120c of the first stacked structure 120.

As shown in FIG. 2, in the embodiment, the conductive structure 221 comprises a plurality of first conductive strips 221a, the insulating structure 223 comprises a plurality of first insulating strips 223a, the first conductive strips 221a and the first insulating strips 223a are stacked in a staggered way, and each of the first conductive strips 221a is separated from others by the first insulating strips 223a.

Third Embodiment

Figure 3:
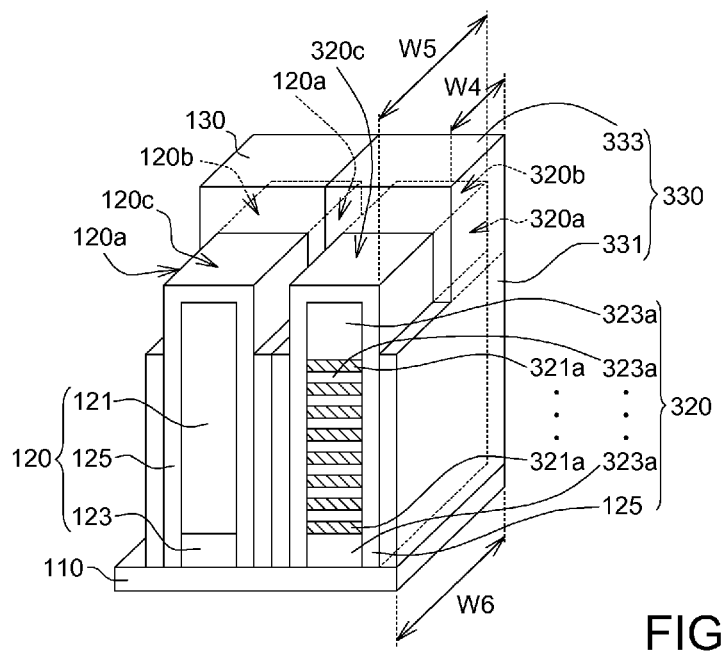
FIG. 3 shows a semiconductor structure according to the third embodiment of the present disclosure.

Referring to FIG. 3, FIG. 3 shows a semiconductor structure according to the third embodiment of the present disclosure. The elements in the third embodiment and in the first and second embodiments sharing the same labeling are the same elements, and the description of which are as aforementioned.

The semiconductor structure 300 comprises the substrate 110, the first stacked structure 120, and the first conductive layer 130. The first stacked structure 120 is formed on the substrate 110. The first stacked structure 120 comprises the conductive structure 121 and the insulating structure 123, and the conductive structure 121 is disposed adjacent to the insulating structure 123. The first conductive layer 130 is formed on the substrate 110 and surrounds the two sidewalls 120a and the part of the top portion 120b of the first stacked structure 120 for exposing the portion 120c of the first stacked structure 120.

As shown in FIG. 3, in the embodiment, the semiconductor structure 300 further comprises a second stacked structure 320 and a second conductive layer 330. The second stacked structure 320 is formed on the substrate 110 and disposed adjacent to the first stacked structure 120. The second stacked structure 320 comprises a plurality of second conductive strips 321a and a plurality of second insulating strips 323a, the second conductive strips 321a and the second insulating strips 323a are arranged as a staggered form, and each of the second conductive strips 321a is separated from others by the second insulating strips 323a. The second conductive layer 330 is formed on the substrate 110 and surrounds two sidewalls 320a and a part of a top portion 320b of the second stacked structure 320 for exposing a portion 320c of the second stacked structure 320.

The second conductive layer 330 comprises a second main body 331 and a second covering portion 333 disposed on the second main body 331. The second main body 331 covers a lower portion of the two sidewalls 320a of the second stacked structure 320. The second covering portion 333 is integrated with the second main body 331 and covers an upper portion of the two sidewalls 320a and the part of the top portion 320b of the second stacked structure. The width W4 of the second covering portion 333 is smaller than each of the widths W5 of the corresponding sidewalls 320a for exposing the portion 320c of the second stacked structure 320.

As shown in FIG. 3, in the embodiment, the width W6 of the second main body 331 is substantially equal to each of the widths of the sidewalls 320a. The width W4 of the second covering portion 333 is substantially smaller than the width W6 of the second main body 331.

In the embodiment, the second stacked structure 320 further comprises the memory material layer 125. The memory material layer 125 is formed on the substrate 110 and covers the periphery of the second conductive strips 321a and the second insulating strips 323a. In the embodiment, the second conductive layer 330 covers a portion of the memory material layer 125.

In the embodiment, the second conductive layer 330 has a single material, such as polysilicon, and the second conductive layer 330 may have composite materials as well.

Fourth Embodiment

Figure 4:
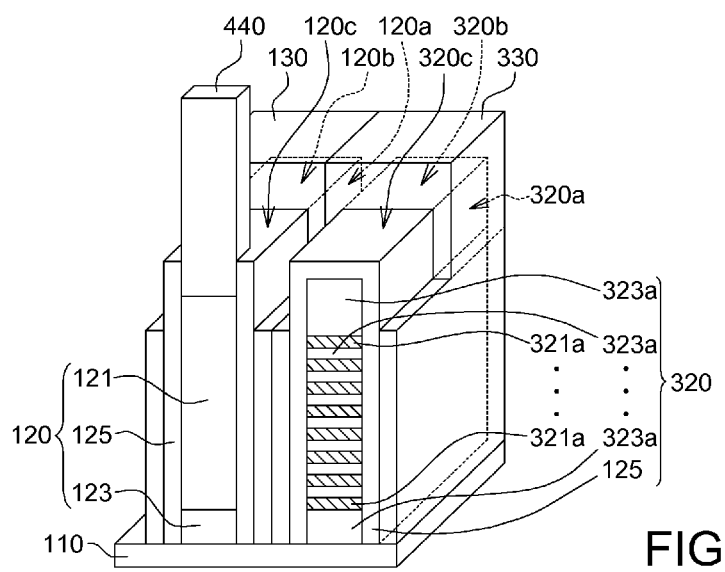
FIG. 4 shows a semiconductor structure according to the fourth embodiment of the present disclosure.

Referring to FIG. 4, FIG. 4 shows a semiconductor structure according to the fourth embodiment of the present disclosure. The elements in the third and fourth embodiments sharing the same labeling are the same elements, and the description of which are as aforementioned.

The semiconductor structure 400 comprises the substrate 110, the first stacked structure 120, the first conductive layer 130, the second stacked structure 320, and a second conductive layer 330.

The first stacked structure 120 is formed on the substrate 110. The first stacked structure 120 comprises the conductive structure 121 and the insulating structure 123, and the conductive structure 121 is disposed adjacent to the insulating structure 123. The first conductive layer 130 is formed on the substrate 110 and surrounds the two sidewalls 120a and the part of the top portion 120b of the first stacked structure 120 for exposing the portion 120c of the first stacked structure 120. The second stacked structure 320 is formed on the substrate 110 and disposed adjacent to the first stacked structure 120. The second conductive layer 330 is formed on the substrate 110 and surrounds the two sidewalls 320a and the part of the top portion 320b of the second stacked structure 320 for exposing the portion 320c of the second stacked structure 320.

As shown in FIG. 4, in the embodiment, the conductive structure 121 is, for example, a conductive layer, and the insulating structure 123 is, for example, an insulating layer. The conductive layer is disposed on the insulating layer. The second stacked structure 320 comprises the plurality of second conductive strips 321a and the plurality of second insulating strips 323a, the second conductive strips 321a and the second insulating strips 323a are stacked in a staggered way, and each of the second conductive strips 321a is separated from others by the second insulating strips 323a.

The fourth embodiment is elaborated with the first stacked structure 120 comprising the conductive layer 121 and the insulating layer 123 and the second stacked structure 320 comprising the plurality of conductive strips 321a and the plurality of insulating strips 323a which are stacked in a staggered way. However, in actual applications, the first stacked structure 120 and the second stacked structure 320 may independently comprise a conductive layer and an insulating layer or a plurality of conductive strips and a plurality of insulating strips which are stacked in a staggered way. The structural arrangements of the first stacked structure 120 and the second stacked structure 320 are depending on the conditions applied and are not limited to the structural arrangements aforementioned.

As shown in FIG. 4, the semiconductor structure 400 further comprises a conductive element 440. The conductive element 440 is disposed on the first stacked structure 120 and electrically connected to the conductive structure 121. In the embodiment, the semiconductor structure 400 can be used as a gate select line (SSL) in a three-dimensional memory array.

Further, the first conductive layer 130 surrounds the two sidewalls 120a and the part of the top portion 120b of the first stacked structure 120 for exposing the portion 120c of the first stacked structure 120. As such, there is a distance between the conductive element 440 and the first conductive layer 130, such that the conductive element 440 does not contact the first conductive layer 130 to create a short circuit.

Fifth Embodiment

Figure 5:
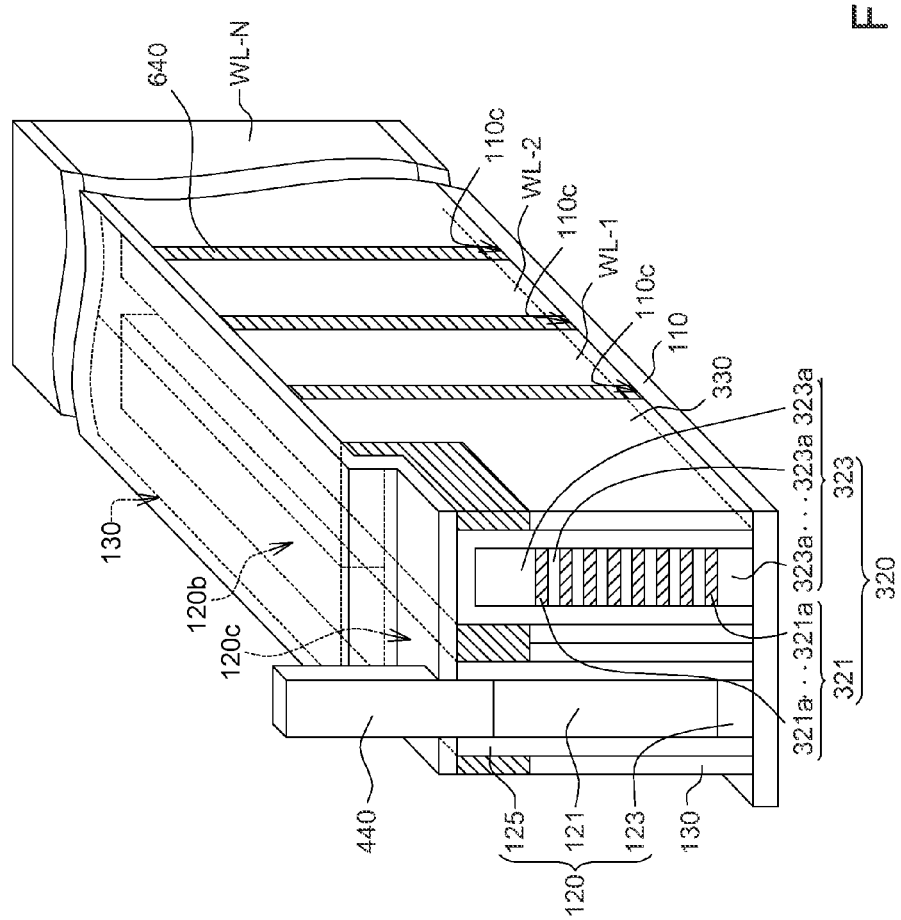
FIG. 5 shows a semiconductor structure according to the fifth embodiment of the present disclosure.

Referring to FIG. 5, FIG. 5 shows a semiconductor structure according to the fifth embodiment of the present disclosure. The elements in the fourth and fifth embodiments sharing the same labeling are the same elements, and the description of which are as aforementioned.

The semiconductor structure 500 comprises the substrate 110, the first stacked structure 120, the first conductive layer 130, the second stacked structure 320, the second conductive layer 330, the conductive element 440, and a plurality of word line structures WL-1~WL-N. The first stacked structure 120 comprises the conductive structure 121 and the insulating structure 123, and the conductive structure 121 is disposed adjacent to the insulating structure 123. The second stacked structure 320 comprises the plurality of second conductive strips 321a and the plurality of second insulating strips 323a, and the second conductive strips 321a and the second insulating strips 323a are stacked in a staggered way. The conductive element 440 is disposed on the first stacked structure 120 and electrically connected to the conductive structure 121. The word line structures WL-1~WL-N are formed on the substrate 110.

Each of the word line structures WL-1~WL-N comprises a plurality of conductive strips and at least a stacked structure similar to the second stacked structure 320. As such, the conductive structure 121 of the first stacked structure 120 and the second conductive strips 321a of the second stacked structure 320 are connected to the conductive strip of the word line structures WL-1~WL-N. The word line structures WL-1~WL-N are arranged adjacent to the first stacked structure 120 and the second stacked structure 320, and the second conductive strips 321a are connected to the conductive strips of the word line structures WL-1~WL-N. The word line structures WL-1~WL-N, the first stacked structure 120, and the second stacked structure 320 are arranged in parallel. In the embodiment, the semiconductor structure 500 further comprises an insulating layer 640 formed in the intervals 100c between the adjacent word line structures WL-1~WL-N. The insulating layer 640 in the intervals 100c separates each of the word line structures WL-1~WL-N from others, and hence the word line structures WL-1~WL-N is protected from short circuits. In actual applications, the semiconductor structure 500 may be a combination of a gate select line and a source line in a three-dimensional NAND flash memory array, such that the space elements occupied in the memory array can be reduced.

<Semiconductor Structures Applied in Memory Devices>

Figure 6:
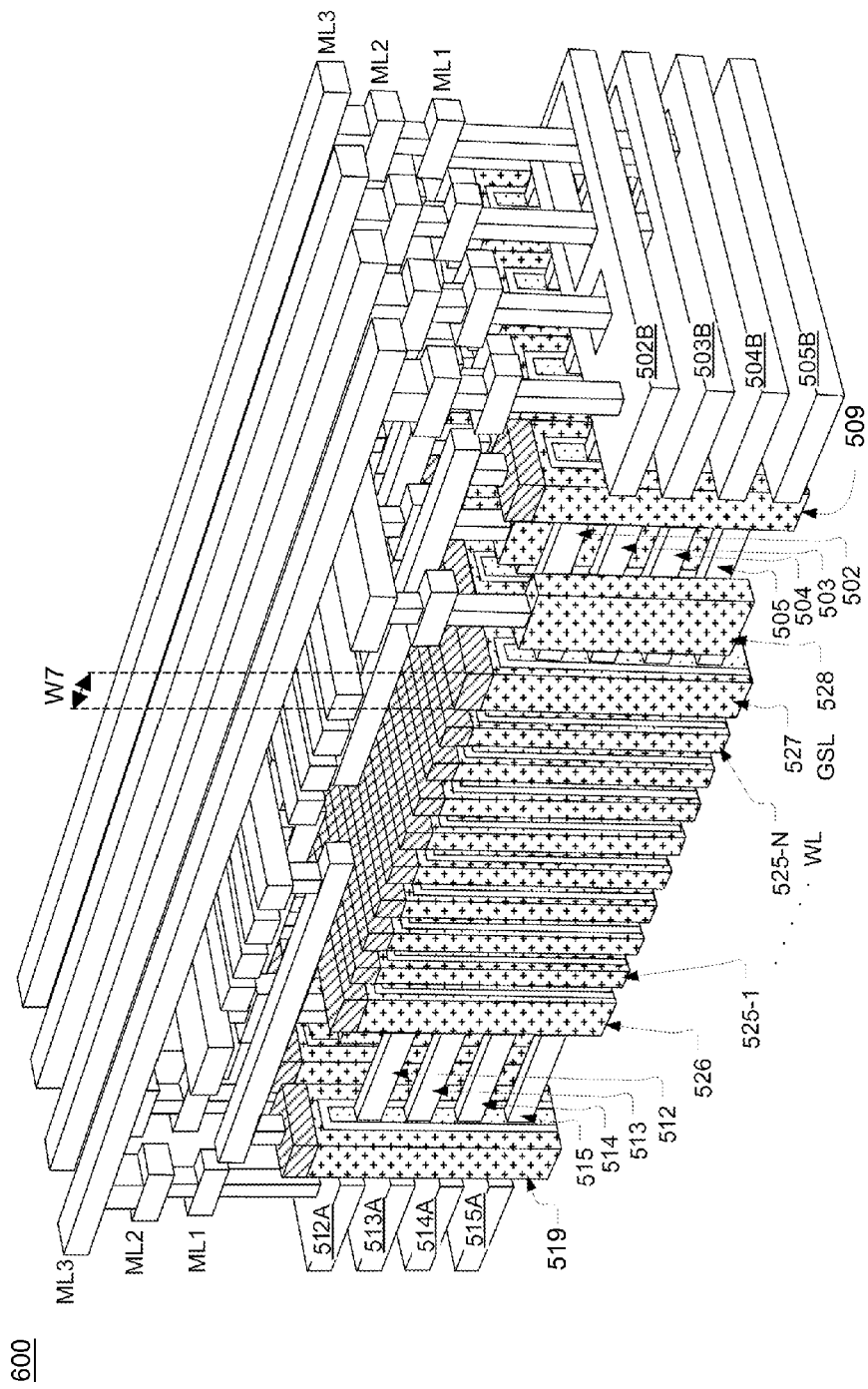
FIG. 6 shows a three-dimensional NAND flash memory array.

Referring to FIG. 6, FIG. 6 shows a three-dimensional NAND flash memory array. The three-dimensional NAND flash memory array 600 comprises metal layers of string select lines ML1 and ML2, a plurality of conductive strips 502~505 and 512~515 parallel to the string select lines ML1, a plurality of word lines 525-1~525-N vertical to the string select lines ML1, and a plurality of bite lines ML3 parallel to the conductive strips 502~505 and 512~515. Memory elements of the three-dimensional array are accessible via the interface regions of the conductive strips 502~505 and 512~515 and the word lines 525-1~525-N. The stacked structures of conductive strips 502~505 and 512~515 can be divided into an odd-numbered group of conductive strips 502~505 and an even-numbered group of conductive strips 512~515. The odd-numbered group of conductive strips 512~515 starts from the first end having a plurality of stairstep structures 512A~515A and passes through string select line gate structure 519, gate select line 526, word lines 525-1~525-N, and gate select line 527 to reach source line 528 of the second end of the conductive strips 512~515. The even-numbered group of conductive strips 502~505 starts from the first end having source line 528 and passes through gate select line 527, word lines 525-1~525-N, gate select line 526, and string select line gate structure 509 to reach stairstep structures 502B~505B of the second end of the conductive strips 502~505. The path length between the gate select line 527 and the source line 528 is relatively longer than the path lengths between the word lines 525-1~525-N. Therefore, to reduce the resistance of the current path along the conductive strips, an implantation can be applied to increase the doping concentration in the conductive strips between the gate select line 527 and the source line 528, or an assistant gate can be disposed between the gate select line 527 and the source line 528.

Referring to FIGS. 4 and 6, take the fourth embodiment as an example, semiconductor structure 400 is a three-dimensional vertical gate memory device, such as a three-dimensional flash memory device. A metal silicide layer (not shown) can be formed on the first conductive layer 130 and the second conductive layer 330, and the metal silicide layer can be such as WSi. In the embodiment, with the semiconductor structure 400 as shown in FIG. 4 disposed on two ends of the three-dimensional NAND flash memory array 600 as shown in FIG. 6 as a gate select line, the second conductive strips 321a (FIG. 4) extend to the stairstep structures (FIG. 6) at an end of the memory array. The conductive element 440 (FIG. 4) connects ground at an end of the memory array as a source line.

Take the memory array 600 in FIG. 6 as an example for further illustration, four semiconductor structures 400 (FIG. 4) are disposed on a first end, which is adjacent to the stairstep structures 502B~505B (FIG. 6), of the memory array 600 (FIG. 6), and another four semiconductor structures 400 (FIG. 4) are disposed on a second end, which is adjacent to the stairstep structures 512A~515A (FIG. 6), of the memory array 600 (FIG. 6). Further, in the embodiment, the semiconductor structure 400 (FIG. 4) replaces the gate select line 527, the source line 528, and the string select line gate structure 509, and the width W2 (referring to FIG. 1) of the first main body 131 of the first conductive layer 130 and the width W5 (referring to FIG. 3) of the second main body 331 of the second conductive layer 330 are substantially equal to or larger than the width W7 of the gate select line 527 (FIG. 6). As such, replacing the gate select line 527, the source line 528, and the string select line gate structure 509 (FIG. 6) with one semiconductor structure 400 (FIG. 4) can reduce the resistance of the current path along the conductive strips caused by the long path length between the gate select line 527 and the source line 528. Further, the word line etching process is not affected by the installation of the source line 528. Moreover, the three-dimensional memory array 600 has a multi-layer structure, which requires high energy implantation. In the embodiment, it does not require an implantation to the conductive strips for increasing the doping concentration, such that the damage to the source line due to the high energy implantation can be reduced, and the non-uniformity between layers caused by implantation to the multi-layer structure, which means that the doping concentrations of upper layers and lower layers are different, can be eliminated. Meanwhile, the original gate select line 527, source line 528, and string select line gate structure 509 (FIG. 6) are replaced by one semiconductor structure 400 (FIG. 4), the whole path length of the original gate select line 527 and source line 528 can be reduced, and hence the dimension and the manufacturing cost of the memory array 600 can be reduced as well.

<Manufacturing Method of Semiconductor Structures>

The embodiments disclosed below are for elaborating the manufacturing methods of semiconductor structures of the disclosure. However, the descriptions disclosed in the embodiments of the disclosure such as detailed manufacturing procedures are for illustration only, not for limiting the scope of protection of the disclosure. Referring to FIG. 7A~FIG. 7C and FIG. 8A~FIG. 8H, FIG. 7A~FIG. 7C illustrate a process for manufacturing a semiconductor structure according to one embodiment of the present disclosure, and FIG. 8A~FIG. 8H illustrate a process for manufacturing a semiconductor structure according to another embodiment of the present disclosure.

The disclosure below is for elaborating the manufacturing procedure of semiconductor structure 100 as shown in FIG. 1.

Figure 7A:
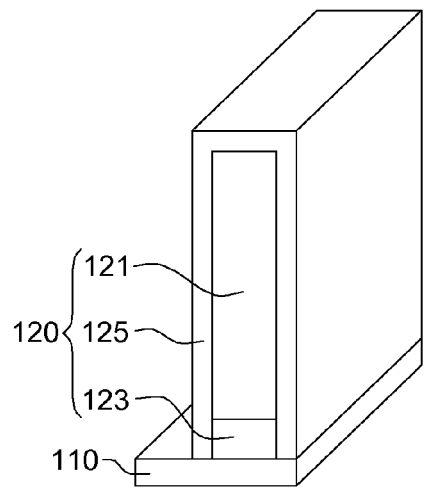
FIG. 7A~FIG. 7C illustrate a process for manufacturing a semiconductor structure according to one embodiment of the present disclosure.

Referring to FIG. 7A, a first stacked structure 120 is formed on a substrate 110. In the embodiment, the manufacturing method of the first stacked structure 120 comprises, for example: forming an insulating structure 123 on the substrate 110 and disposing a conductive structure 121 adjacent to the insulating structure 123. In an embodiment, the manufacturing method of the first stacked structure 120 further comprises: forming a memory material layer 125 on the substrate 110, and the memory material layer 125 covers the periphery of the conductive structure 121 and the insulating structure 123.

Figure 7B:
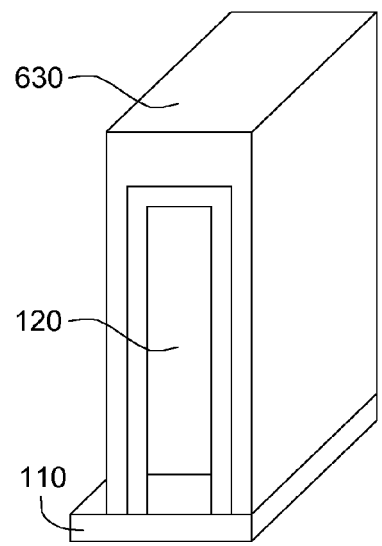

Referring to FIG. 7B, a conductive material layer 630 is formed on the substrate 110. In the embodiment, the conductive material layer 630 fully covers two sidewalls 120a and a top portion of the first stacked structure 120. In the embodiment, the materials for the conductive material layer 630 comprise metals, such as polysilicon. However, the materials selections for the conductive material layer 630 are depending on the conditions applied and are not limited to the materials aforementioned.

Figure 7C:
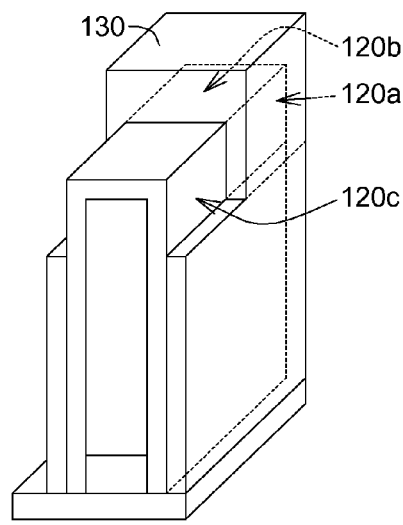

Referring to FIG. 7C, the conductive material layer 630 is etched to form a first conductive layer 130 for exposing a portion 120c of the first stacked structure 120. In the embodiment, the portion 120c of the first stacked structure 120 comprises a portion of the memory material layer 125. In an etching process, the conductive material layer 630 (such as a polysilicon) is etched, and the memory material layer 125 (such an ONO structure) of the first stacked structure 120 is not etched, since the process has an appropriate etching selectivity to the conductive material layer 630 and the memory material layer 125. The first conductive layer 130 surrounds the two sidewalls 120a and a part of the top portion 120b of the first stacked structure 120. As such, the semiconductor structure 100 as shown in FIG. 1 is formed.

The disclosure below is for elaborating the manufacturing procedure of semiconductor structure 200 as shown in FIG. 2. The elements in the manufacturing procedures of the semiconductor structure 100 and semiconductor structure 200 sharing the same labeling are the same elements, and the description of which and related procedures are as aforementioned.

In the embodiment, a first stacked structure 220 is formed on the substrate 110. In the embodiment, the manufacturing method of the first stacked structure 220 comprises, for example: forming a plurality of first insulating strips 223a on the substrate 110 and forming a plurality of first conductive strips 221a, the first conductive strips 221a and the first insulating strips 223a are stacked in a staggered way, and each of the first conductive strips 221a is separated from others by the first insulating strips 223a. In the embodiment, the step of forming the first stacked structure 220 on the substrate 110 and the step of forming the first stacked structure 120 on the substrate 110 are carried out at the same stage in the manufacturing procedure.

Subsequently, a conductive material layer 630 is formed on the substrate 110. The conductive material layer 630 fully covers the two sidewalls and a top portion of the first stacked structure 220. Next, the conductive material layer 630 is etched to form a first conductive layer 130 for exposing a portion 220c of the first stacked structure 220. As such, the semiconductor structure 200 as shown in FIG. 2 is formed.

The disclosure below is for elaborating the manufacturing procedure of semiconductor structure 300 as shown in FIG. 3.

Figure 8A:
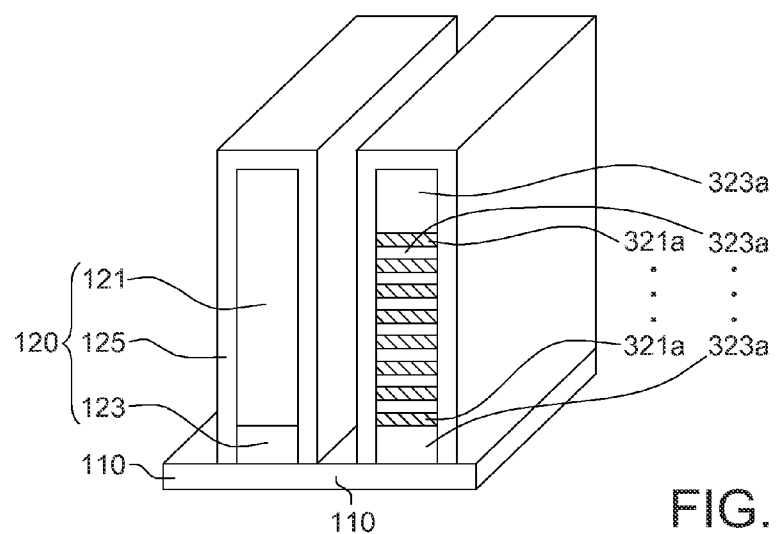
FIG. 8A~FIG. 8H illustrate a process for manufacturing a semiconductor structure according to another embodiment of the present disclosure.

Referring to FIG. 8A, the first stacked structure 120 is formed on the substrate 110 and a second stacked structure 320 is formed on the substrate 110 and disposed adjacent to the first stacked structure 120. In the embodiment, the step of forming the first stacked structure 120 on the substrate 110 and the step of forming the second stacked structure 320 on the substrate 110 are carried out at the same time. In the embodiment, the manufacturing method of the first stacked structure 120 comprises, for example: forming the insulating structure 123 on the substrate 110 and disposing the conductive structure 121 adjacent to the insulating structure 123 the manufacturing method of the second stacked structure 320 comprises, for example: forming a plurality of second insulating strips 323a on the substrate 110 and forming a plurality of second conductive strips 321a, the second conductive strips 321a and the second insulating strips 323a are arranged as a staggered form, and each of the second conductive strips 321a is separated from others by the second insulating strips 323a.

In an embodiment, the manufacturing method of the first stacked structure 120 and the second stacked structure 320 further comprises: forming a memory material layer 125 on the substrate 110. The memory material layer 125 covers the periphery of the conductive structure 121 and the insulating structure 123 and the periphery of the second conductive strips 321a and the second insulating strips 323a.

Figure 8B:
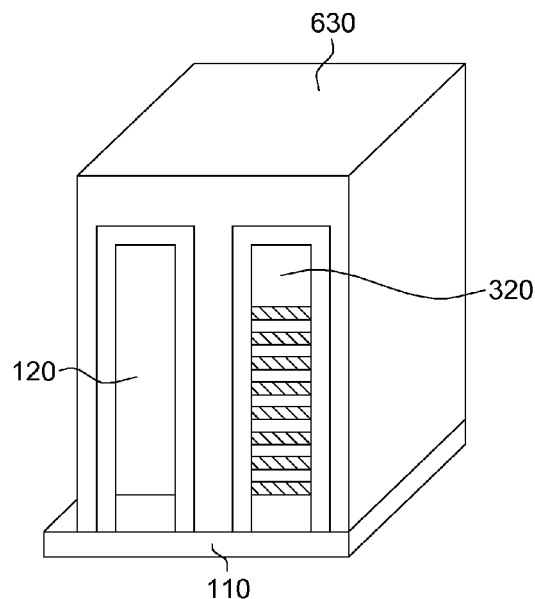

Referring to FIG. 8B, the conductive material layer 630 is formed on the substrate 110. In the embodiment, the conductive material layer 630 fully covers the two sidewalls 120a and the top portion of the first stacked structure 120, and the conductive material layer 630 fully covers two sidewalls 320a and a top portion of the second stacked structure 320. In the embodiment, the step of covering the two sidewalls 120a and the top portion of the first stacked structure 120 with the conductive material layer 630 and the step of covering the two sidewalls 320a and the top portion of the first stacked structure 320 with the conductive material layer 630 are carried out at the same time.

Figure 8C:
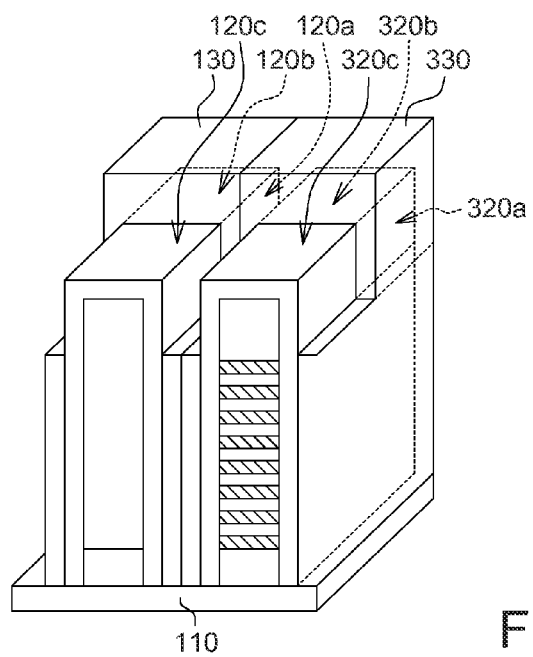

Referring to FIG. 8C, the conductive material layer 630 is etched to form the first conductive layer 130 for exposing the portion 120c of the first stacked structure 120, and the conductive material layer 630 is etched to form a second conductive layer 330 for exposing a portion 320c of the second stacked structure 320. In the embodiment, the step of etching the conductive material layer 630 to form the first conductive layer 130 and the step of etching the conductive material layer 630 to form the second conductive layer 330 are carried out at the same time. In the embodiment, the first conductive layer 130 surrounds the two sidewalls 120a and the part of the top portion 120b of the first stacked structure 120, and the second conductive layer 330 surrounds the two sidewalls 320a and the part of the top portion 320b of the second stacked structure 320. As such, the semiconductor structure 300 as shown in FIG. 3 is formed.

The disclosure below is for elaborating the manufacturing procedure of semiconductor structure 400 as shown in FIG. 4. The disclosure below starts after the step of etching the conductive material layer 630 to form the first conductive layer 130 and the second conductive layer 330.

Figure 8D:
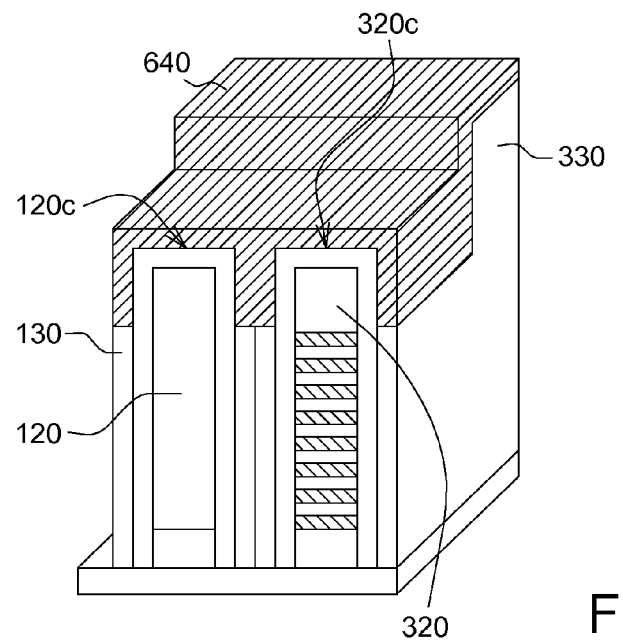

Referring FIG. 8D, an insulating layer 640 is formed on the first conductive layer 130 and the exposed portion 120c of the first stacked structure 120. In the embodiment, the insulating layer 640 can further be formed on the second conductive layer 330 and the exposed portion 320c of the second stacked structure 320, and which is carried out together with the step of forming the insulating layer 640 on the first conductive layer 130 and the exposed portion 120c of the first stacked structure 120. In the embodiment, the materials for the insulating layer 640 comprise metal oxides. However, the material selections for the insulating layer 640 are depending on the conditions applied and are not limited to the materials aforementioned.

Figure 8E:
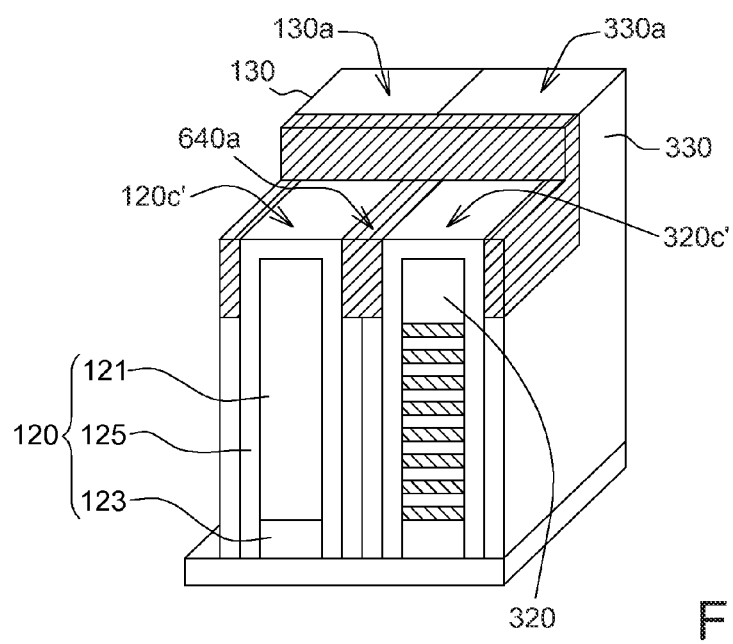

Referring to FIG. 8E, the insulating layer 640 is etched for exposing an upper surface 120c' of the exposed portion 120c of the first stacked structure 120. In the embodiment, the insulating layer 640 can further be etched for exposing an upper surface 320c' of the exposed portion 320c of the second stacked structure 320, and which is carried out together with the step of etching the insulating layer 640 for exposing the upper surface 120c' of the exposed portion 120c of the first stacked structure 120. In the embodiment, after the insulating layer 640 is etched, an upper surface 130a of the first conductive layer 130 and an upper surface 330a of the second conductive layer 330 are exposed as well. In the embodiment, the etched insulating layer 640 has a surface 640a, and the surface 640a is coplanar with the upper surface 130a and the upper surface 330a. In the embodiment, in an etching process, the insulating layer 640 (such as a metal oxide) is etched, and the memory material layer 125 (such an ONO structure) is not etched, since the process has an appropriate etching selectivity to the insulating layer 640 and the memory material layer 125. Further, in an etching process, the insulating layer 640 (such as a metal oxide) is etched, and the first conductive layer 130 and the second conductive layer 330 (such an polysilicon) is not etched, since the process has an appropriate etching selectivity to the insulating layer 640 and the first conductive layer 130 and the second conductive layer 330.

Figure 8F:
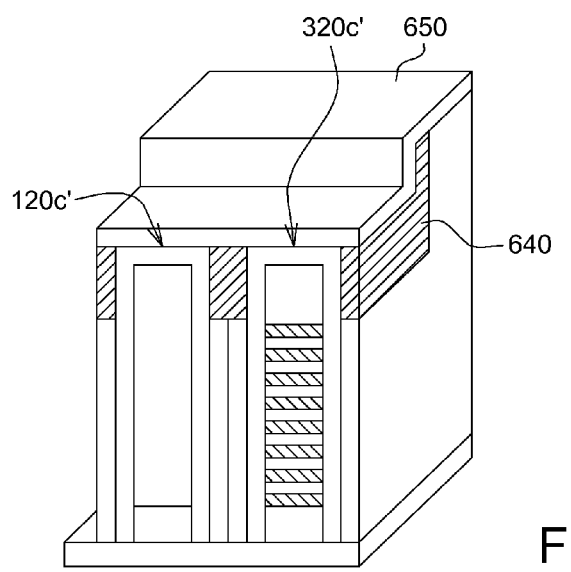

Referring to FIG. 8F, a stopping layer 650 is formed on the insulating layer 640 and the upper surface 120c' of the exposed portion 120c of the first stacked structure 120. In the embodiment, the stopping layer 650 can further be formed on the upper surface 320c' of the exposed portion 320c of the second stacked structure 320, and which is carried out together with the step of forming the stopping layer 650 on the insulating layer 640 and the upper surface 120c' of the exposed portion 120c of the first stacked structure 120. In the embodiment, the materials for the stopping layer 650 comprise nitrides, such as silicon nitrides. However, the material selections for the stopping layer 650 are depending on the conditions applied and are not limited to the materials aforementioned.

Figure 8G:
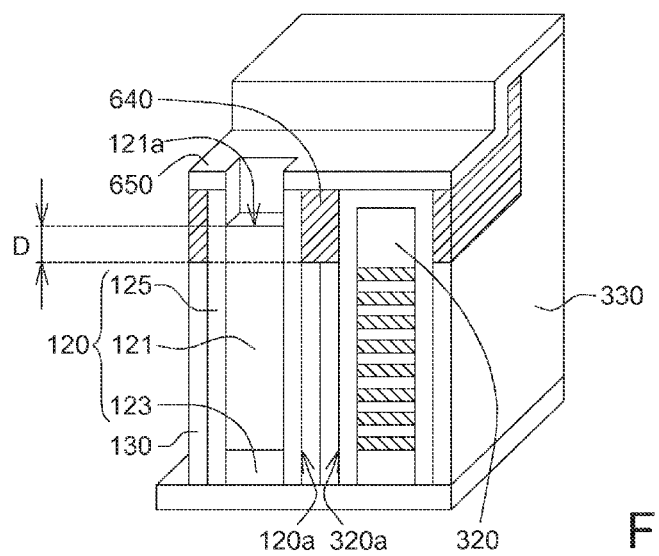

Referring to FIG. 8G, the stopping layer 650 and the memory material layer 125 are etched for exposing an upper surface 121a of a portion of the conductive structure 121. In the embodiment, there is an interface 640b between the insulating layer 640 and a portion of the first conductive layer 130 and the second conductive layer 330 adjacent to the sidewalls 120a of the first stacked structure 120 and the sidewalls 320a of the second stacked structure 320. There is a height difference D between the interface 640b and the upper surface 121a of the conductive structure 121. Due to the height difference D, the stopping layer 650 and a to-be-etched portion of the memory materials layer 125 are adjacent to the insulating layer 640, and the stopping layer 650 and the to-be-etched portion of the memory materials layer 125 are not adjacent to the first conductive layer 130 and the second conductive layer 330. Further, in an etching process, the stopping layer 650 (such as a silicon nitride) and the memory material layer 125 (such as an ONO structure) are etched, and the insulating layer 640 (such as a metal oxide) is not etched, since the process has an appropriate etching selectivity to the stopping layer 650 and the memory material layer 125 and the insulating layer 640.

Figure 8H:
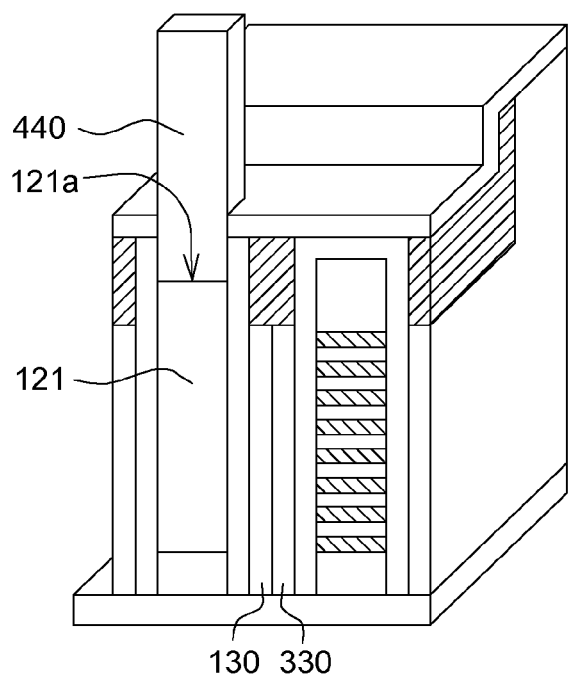

Referring to FIG. 8H, a conductive element 440 is formed on the upper surface 121a of the portion of the conductive structure 121. In the embodiment, due to the height difference D, the stopping layer 650 and the memory materials layer 125 are etched, and the insulating layer 640 is not etched, as such, short circuits do not occur between the conductive element 440 and the first conductive layer 130 and/or between the conductive element 440 and the second conductive layer 330. As such, the semiconductor structure 400 as shown in FIG. 4 is formed.

The disclosure below is for elaborating the manufacturing procedure of semiconductor structure 500 as shown in FIG. 5. The disclosure below starts after the steps of forming the first stacked structure 120 and forming the second stacked structure 320. The elements in the manufacturing procedures of the semiconductor structure 400 and semiconductor structure 500 sharing the same labeling are the same elements, and the description of which and related procedures are as aforementioned.

Referring to FIG. 5, a plurality of word line structures WL-1~WL-N are formed on the substrate 110. In the embodiment, each of the word line structures WL-1~WL-N comprises a plurality of conductive strips and at least a stacked structure similar to the second stacked structure 320. The step of forming the word line structures WL-1~WL-N and the steps of forming the first stacked structure 120 and forming the second stacked structure 320 are carried out at the same time. Each of the conductive strips of the word line structures WL-1~WL-N is connected to each of the corresponding second conductive strips 321a, such that the word line structures WL-1~WL-N are arranged adjacent to the first stacked structure 120 and the second stacked structure 320, and the word line structures WL-1~WL-N, the first stacked structure 120, and the second stacked structure 320 are arranged in parallel.

In the embodiment, the insulating layer 640 is formed on the word line structures WL-1~WL-N and in the intervals 110c between the adjacent word line structures WL-1~WL-N. In the embodiment, the step of forming the insulating layer 640 on the word line structures WL-1~WL-N and in the intervals 110c between the adjacent word line structures WL-1~WL-N, the step of forming an insulating layer 640 on the first conductive layer 130 and the exposed portion 120c of the first stacked structure 120, and the step of forming the insulating layer 640 on the second conductive layer 330 and the exposed portion 320c of the second stacked structure 320 are carried out at the same time.

In the embodiment, the insulating layer 640 is etched for exposing an upper surface of the word line structures WL-1~WL-N, and which is carried out together with the step of etching the insulating layer 640 for exposing the upper surface 120c' of the exposed portion 120c of the first stacked structure 120 and the step of etching the insulating layer 640 for exposing the upper surface 320c' of the exposed portion 320c of the second stacked structure 320. In the embodiment, a part of the insulating layer 640 is not etched and remained in the intervals 110c between the adjacent word line structures WL-1~WL-N, such that the word line structures WL-1~WL-N are protected from short circuits. As such, the semiconductor structure 500 as shown in FIG. 5 is formed.

According to the aforementioned description, the semiconductor structure and methods of manufacturing the same are exemplified. In the embodiments, the first conductive layer of the semiconductor structure surrounds two sidewalls and a part of the top portion of the first stacked structure for exposing a portion of the first stacked structure, such that the conductive element does not easily contact the first conductive layer to create a short circuit. Further, the semiconductor structure in the embodiments can be a combination of a gate select line and a source line in a three-dimensional NAND flash memory array, such that the space elements occupied in the memory array can be reduced. Moreover, the semiconductor structure in the embodiments can function as a gate select line, a source line, and a string select line gate structure in combination, which reduces the damage to the elements in the memory array due to the high energy implantation, shortens the whole path lengths of the memory array, and reduces the dimension and the manufacturing cost of the memory array as well.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate;
   a first stacked structure formed on the substrate, comprising a conductive structure and an insulating structure, wherein the conductive structure is disposed adjacent to the insulating structure; and
   a first conductive layer formed on the substrate and surrounding two sidewalls and covering a part of a top portion of the first stacked structure for exposing a portion of the first stacked structure, wherein the first conductive layer comprises a first main body and a first covering portion disposed on the first main body, the first main body covers a lower portion of the two sidewalls of the first stacked structure, the first covering portion is integrated with the first main body and covers an upper portion of the two sidewalls and the part of the top portion of the first stacked structure, and the width of the first covering portion is smaller than each of the widths of the corresponding sidewalls for exposing the portion of the first stacked structure.

2. The semiconductor structure according to claim 1, wherein the width of the first main body is substantially equal to each of the widths of the sidewalls.

3. The semiconductor structure according to claim 1, wherein the width of the first covering portion is substantially smaller than the width of the first main body.

4. The semiconductor structure according to claim 1, wherein the conductive structure comprises a plurality of first conductive strips, the insulating structure comprises a plurality of first insulating strips, the first conductive strips and the first insulating strips are stacked in a staggered way, and each of the first conductive strips is separated from others by the first insulating strips.

5. The semiconductor structure according to claim 1, further comprising:
   a second stacked structure formed on the substrate and disposed adjacent to the first stacked structure, wherein the second stacked structure comprises a plurality of second conductive strips and a plurality of second insulating strips, the second conductive strips and the second insulating strips are arranged as a staggered form, and each of the second conductive strips is separated from others by the second insulating strips; and
   a second conductive layer formed on the substrate and surrounding two sidewalls and a part of a top portion of the second stacked structure for exposing a portion of the second stacked structure.

6. The semiconductor structure according to claim 5, wherein the second conductive layer comprises a second main body and a second covering portion disposed on the second main body, the second main body covers a lower portion of the two sidewalls of the second stacked structure, the second covering portion is integrated with the second main body and covers an upper portion of the two sidewalls and the part of the top portion of the second stacked structure, and the width of the second covering portion is smaller than each of the widths of the corresponding sidewalls for exposing the portion of the second stacked structure.

7. The semiconductor structure according to claim 5, wherein the width of the second covering portion is substantially smaller than the width of the second main body.

8. The semiconductor structure according to claim 5, further comprising a plurality of word line structures formed on the substrate, wherein each of the word line structures comprises a plurality of conductive strips, each of the conductive strips is connected to each of the corresponding second conductive strips, such that the word line structures are arranged adjacent to the first stacked structure and the second stacked structure, and the word line structures, the first stacked structure, and the second stacked structure are arranged in parallel.

9. The semiconductor structure according to claim 1, further comprising:

a conductive element disposed on the first stacked structure, and the conductive element is electrically connected to the conductive structure.

10. The semiconductor structure according to claim 1, wherein the first stacked structure comprises a memory material layer formed on the substrate, and the memory material layer covers the periphery of the conductive structure and the insulating structure.

11. The semiconductor structure according to claim 10, wherein the first conductive layer covers a portion of the memory material layer.

* * * * *